(12) United States Patent
Alptekin et al.

(10) Patent No.: US 9,368,493 B2
(45) Date of Patent: Jun. 14, 2016

(54) METHOD AND STRUCTURE TO SUPPRESS FINFET HEATING

(71) Applicant: GLOBALFOUNDRIES Inc., Grand Cayman (KY)

(72) Inventors: Emre Alptekin, Wappingers Falls, NY (US); Viraj Yashawant Sardesai, Poughkeepsie, NY (US); Cung Do Tran, Newburgh, NY (US); Reinaldo Ariel Vega, Wappingers Falls, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 66 days.

(21) Appl. No.: 14/325,668

(22) Filed: Jul. 8, 2014

(65) Prior Publication Data

US 2016/0013184 A1   Jan. 14, 2016

(51) Int. Cl.
| | | |
|---|---|---|
| *H01L 21/00* | (2006.01) | |
| *H01L 27/088* | (2006.01) | |
| *H01L 21/8234* | (2006.01) | |
| *H01L 29/16* | (2006.01) | |
| *H01L 29/06* | (2006.01) | |
| *H01L 21/02* | (2006.01) | |
| *H01L 21/762* | (2006.01) | |
| *H01L 21/3065* | (2006.01) | |

(52) U.S. Cl.
CPC ........ *H01L 27/0886* (2013.01); *H01L 21/0217* (2013.01); *H01L 21/02164* (2013.01); *H01L 21/02378* (2013.01); *H01L 21/02527* (2013.01); *H01L 21/02612* (2013.01); *H01L 21/02664* (2013.01); *H01L 21/3065* (2013.01); *H01L 21/76224* (2013.01); *H01L 21/823431* (2013.01); *H01L 21/823481* (2013.01); *H01L 29/0653* (2013.01); *H01L 29/16* (2013.01)

(58) Field of Classification Search
CPC .................... H01L 29/1606; H01L 21/02527; H01L 23/53276; H01L 51/0045; H01L 21/02664; H01L 21/02444; H01L 29/16; H01L 21/02378; H01L 21/02376; H01L 21/02447; H01L 21/02529; H01L 29/0653; H01L 21/0217; H01L 21/823431; H01L 21/823481; H01L 21/76224
USPC ............................ 438/105, 931; 257/76, 401
See application file for complete search history.

(56) References Cited

U.S. PATENT DOCUMENTS

2012/0261643 A1 * 10/2012  Cohen .................... B82Y 10/00
                                                                       257/27

OTHER PUBLICATIONS

Suemitsu, Maki et al.; Graphene Formation on a 3C-SiC(111) Thin Film Grown on Si(110) Substrate; J. Surf. Sci. Nanotech; vol. 7, pp. 311-313, 2009.

* cited by examiner

*Primary Examiner* — Thien F Tran
(74) *Attorney, Agent, or Firm* — Heslin Rothenberg Farley & Mesiti P.C.

(57) ABSTRACT

Embodiments of the present invention provide structures and methods for heat suppression in finFET devices. Fins are formed in a semiconductor substrate. A graphene layer is formed on a lower portion of the sidewalls of the fins. A shallow trench isolation region is disposed on the structure and covers the graphene layer, while an upper portion of the fins protrudes from the shallow trench isolation region. The graphene layer may also be deposited on a top surface of the base semiconductor substrate. The graphene serves to conduct heat away from the fins more effectively than other dielectric materials.

9 Claims, 5 Drawing Sheets

METHOD AND STRUCTURE TO SUPPRESS FINFET HEATING

FIELD OF THE INVENTION

The present invention relates generally to semiconductor fabrication, and more particularly, to a method and structure to suppress finFET heating.

BACKGROUND OF THE INVENTION

With the continuing trend towards miniaturization of integrated circuits (ICs), there is a need for transistors to have higher drive currents with increasingly smaller dimensions. FinFET technology is becoming more prevalent as device size continues to shrink. However, as semiconductor devices are made smaller and smaller, higher circuit density, increased device current, and increased operational frequency lead to increased heat generation inside the semiconductor integrated circuits (ICs). In fin-type field effect transistor (finFET) technology, the current density is higher and the high current region is both further away from the substrate, and is surrounded on all sides by the gate, exacerbating the heat issues with finFETs. It is therefore desirable to have improvements in finFETs to address the aforementioned challenges.

SUMMARY OF THE INVENTION

In a first aspect, embodiments of the present invention provide a method of forming a semiconductor structure, comprising: forming a plurality of fins on a semiconductor substrate; forming a graphene layer on the plurality of fins; depositing a first shallow trench isolation layer disposed over the graphene layer to an intermediate level of the plurality of fins; recessing the graphene layer to the intermediate level; and depositing a second shallow trench isolation layer disposed over the first shallow trench isolation layer, such that the graphene layer is covered by the second shallow trench isolation layer while an upper portion of each fin of the plurality of fins is exposed.

In a second aspect, embodiments of the present invention provide a semiconductor structure, comprising: a semiconductor substrate; a plurality of fins formed on the semiconductor substrate; a graphene layer in contact with a lower portion of each fin of the plurality of fins; and a shallow trench isolation layer disposed on the semiconductor substrate between each fin of the plurality of fins, and extending to a level above the graphene layer, wherein the graphene layer is covered by the shallow trench isolation layer, and wherein an upper portion of each fin of the plurality of fins protrudes from the shallow trench isolation layer.

In a third aspect, embodiments of the present invention provide a semiconductor structure, comprising: a semiconductor substrate; a plurality of fins formed on the semiconductor substrate; a graphene layer disposed on, and in direct physical contact with a lower portion of sidewalls of each fin of the plurality of fins, and a top surface of the semiconductor substrate; a silicon nitride layer disposed on the graphene layer; and a shallow trench isolation layer disposed on the semiconductor substrate between each fin of the plurality of fins, and extending to a level above the graphene layer, wherein the graphene layer is covered by the shallow trench isolation layer, and wherein an upper portion of each fin of the plurality of fins protrudes from the shallow trench isolation layer.

BRIEF DESCRIPTION OF THE DRAWINGS

The structure, operation, and advantages of the present invention will become further apparent upon consideration of the following description taken in conjunction with the accompanying figures (FIGs.). The figures are intended to be illustrative, not limiting.

Certain elements in some of the figures may be omitted, or illustrated not-to-scale, for illustrative clarity. The cross-sectional views may be in the form of "slices", or "near-sighted" cross-sectional views, omitting certain background lines which would otherwise be visible in a "true" cross-sectional view, for illustrative clarity.

Figure 1:
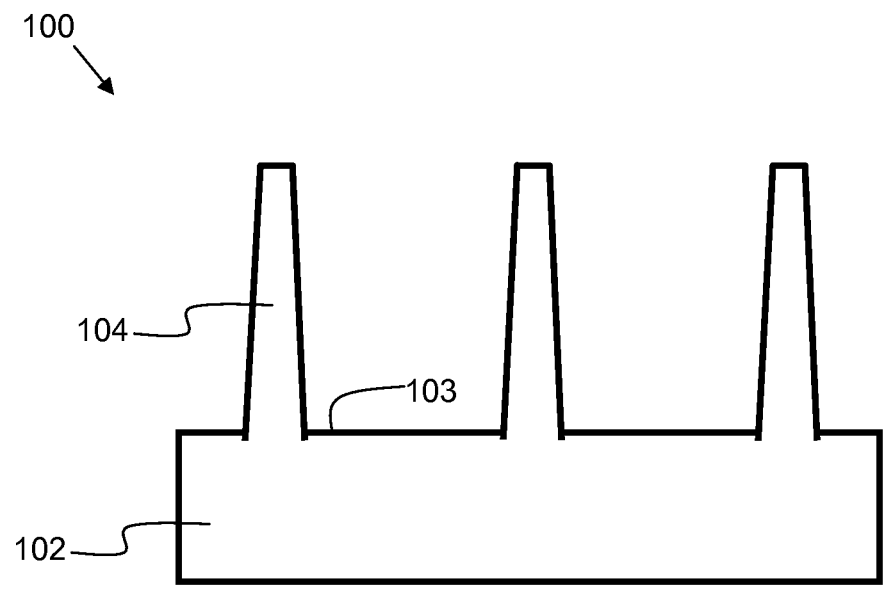

Often, similar elements may be referred to by similar numbers in various figures (FIGs) of the drawing, in which case typically the last two significant digits may be the same, the most significant digit being the number of the drawing figure (FIG). Furthermore, for clarity, some reference numbers may be omitted in certain drawings.

FIG. 1 shows a semiconductor structure at a starting point for embodiments of the present invention.

Figure 2:
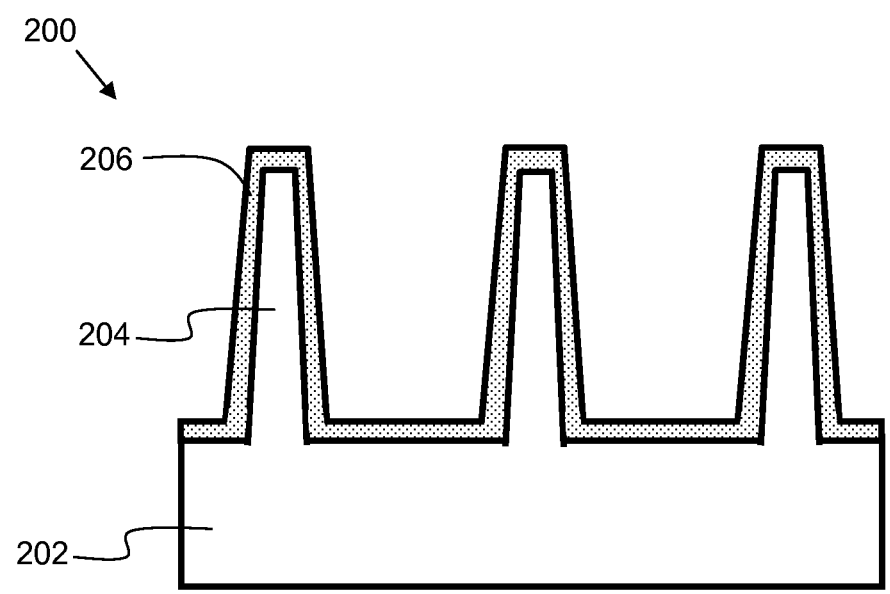

FIG. 2 shows a semiconductor structure after a subsequent process step of depositing a silicon carbide layer in accordance with embodiments of the present invention.

Figure 3:
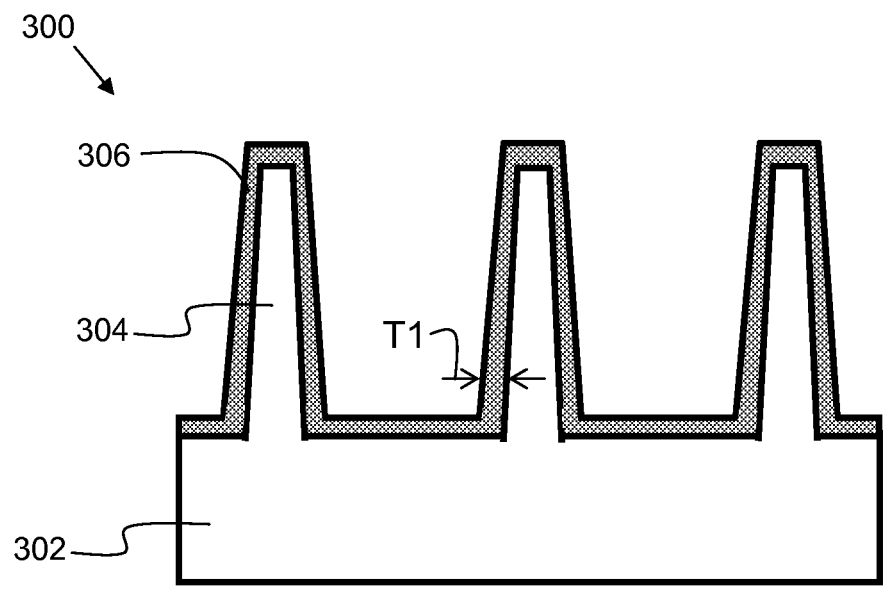

FIG. 3 shows a semiconductor structure after a subsequent process step of performing an anneal to form graphene in accordance with embodiments of the present invention.

Figure 4:
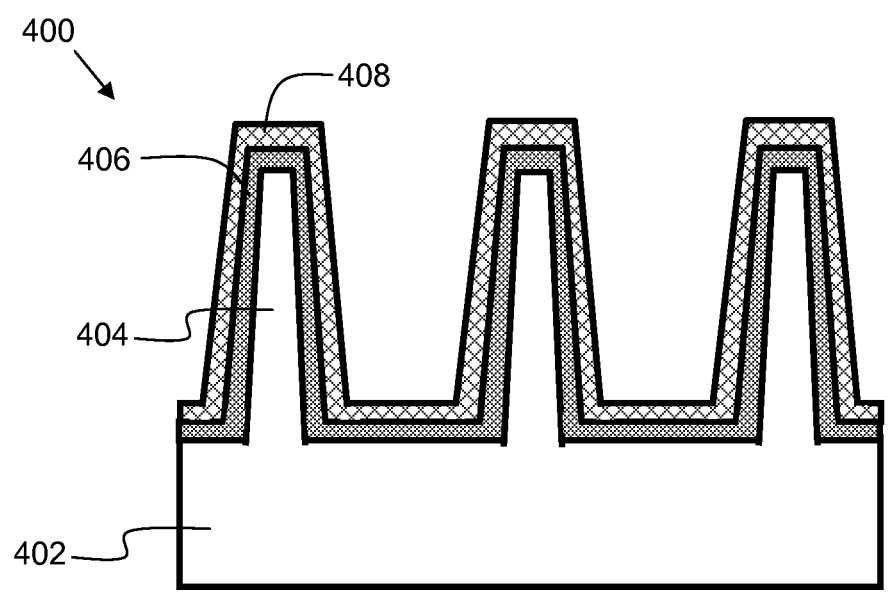

FIG. 4 shows a semiconductor structure after an optional subsequent process step of depositing a protective layer on the graphene in accordance with embodiments of the present invention.

Figure 5:
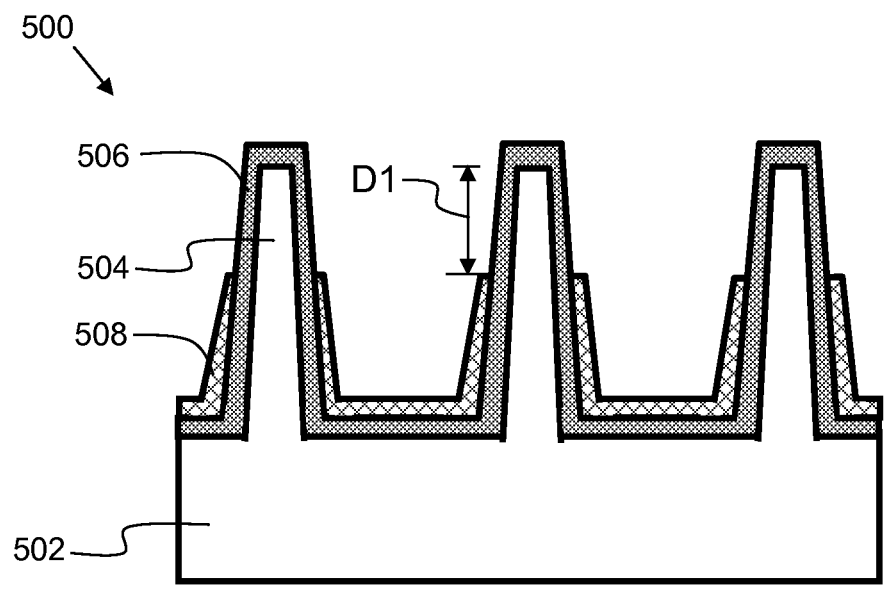

FIG. 5 shows a semiconductor structure after a subsequent process step of recessing the protective layer in accordance with embodiments of the present invention.

Figure 6:
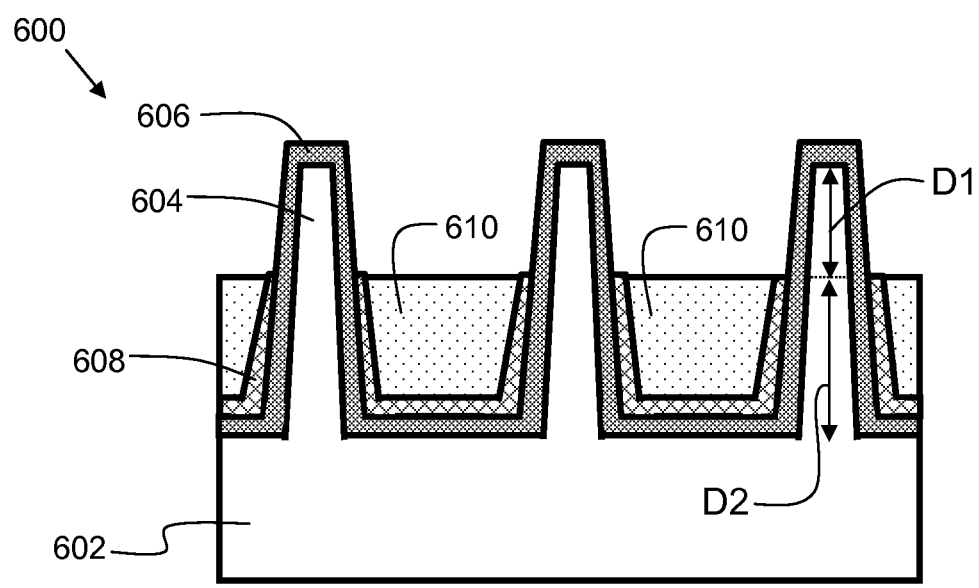

FIG. 6 shows a semiconductor structure after a subsequent process step of depositing a shallow trench isolation layer in accordance with embodiments of the present invention.

Figure 7:
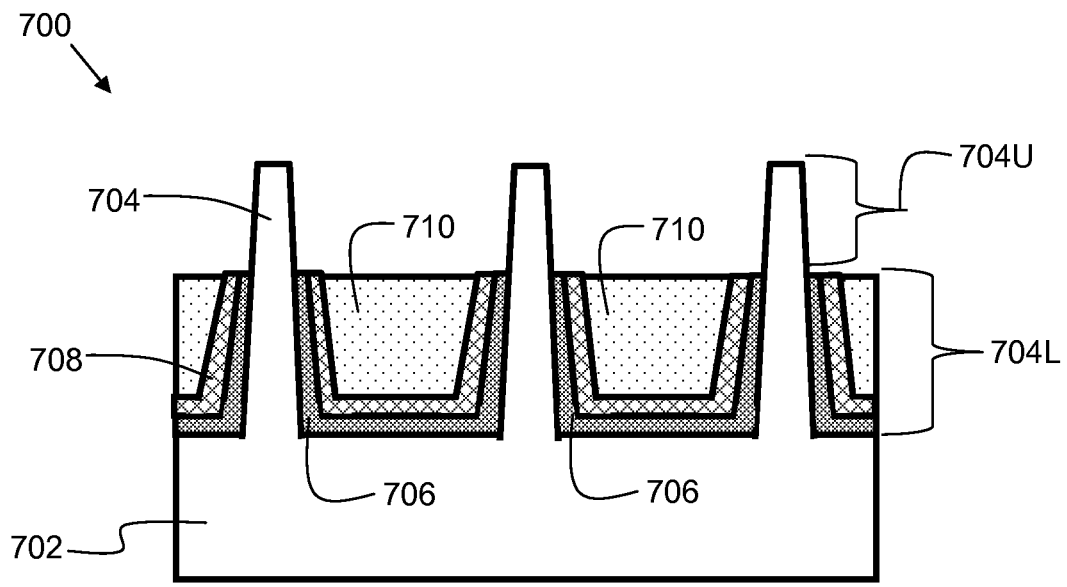

FIG. 7 shows a semiconductor structure after a subsequent process step of performing a graphene etch in accordance with embodiments of the present invention.

Figure 8:
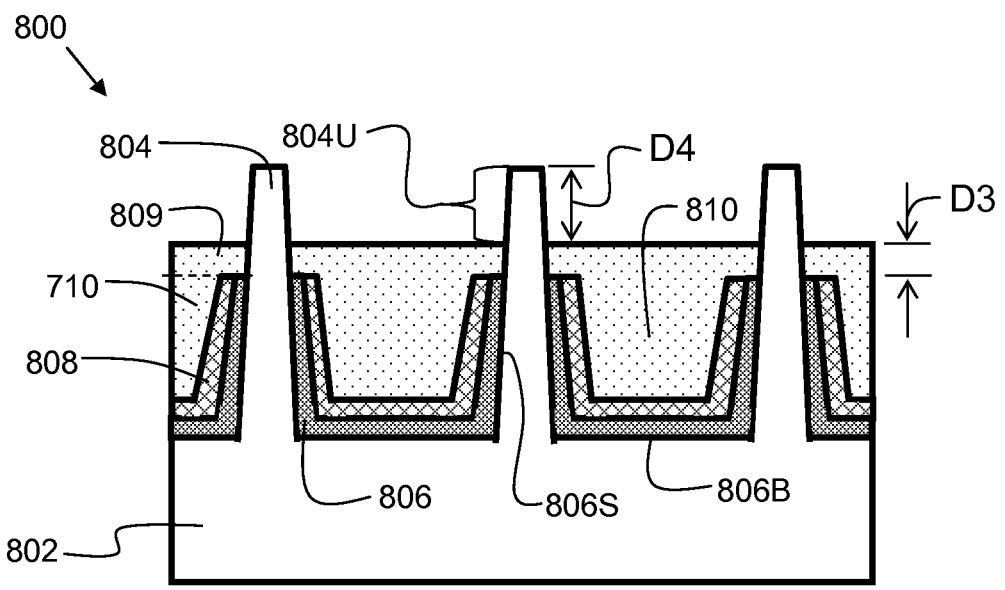

FIG. 8 shows a semiconductor structure after a subsequent process step of depositing additional shallow trench isolation layer material in accordance with embodiments of the present invention.

Figure 9:
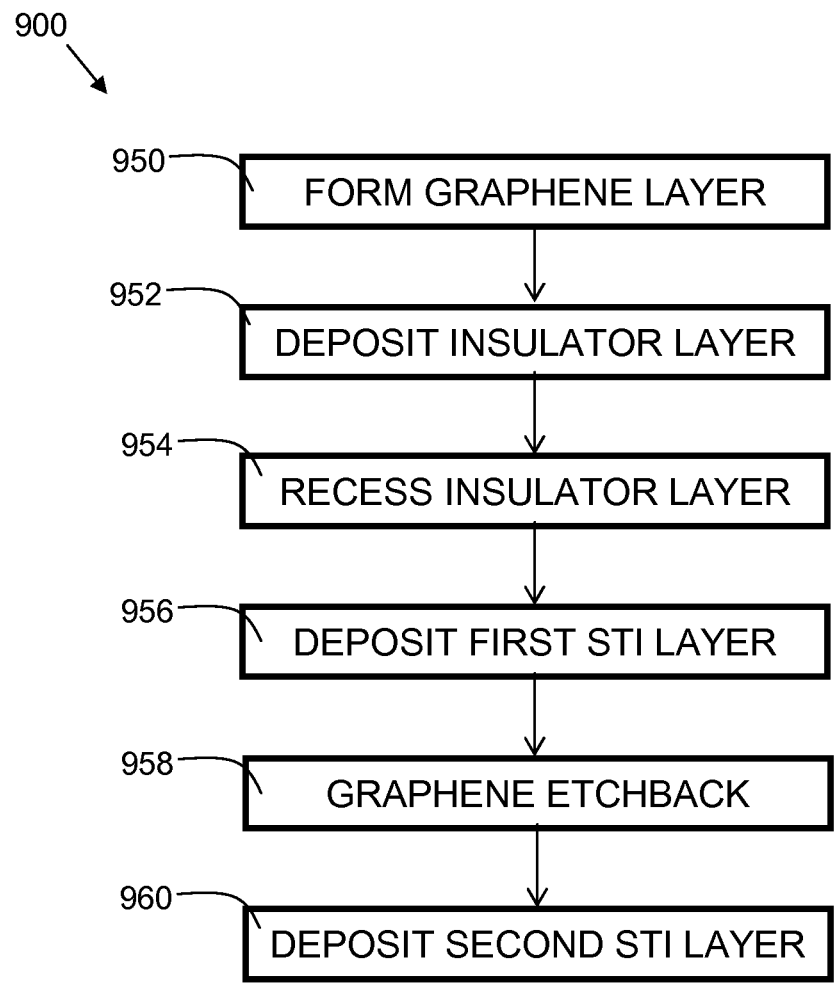

FIG. 9 is a flowchart indicating process steps for embodiments of the present invention.

DETAILED DESCRIPTION

Embodiments of the present invention provide structures and methods for heat suppression in finFET devices. Fins are formed in a semiconductor substrate. A graphene layer is formed on a lower portion of the sidewalls of the fins. A shallow trench isolation region is disposed on the structure and covers the graphene layer, while an upper portion of the fins protrudes from the shallow trench isolation region. The graphene layer may also be deposited on a top surface of the base semiconductor substrate. The graphene serves to conduct heat away from the fins more effectively than other dielectric materials.

FIG. 1 shows a semiconductor structure 100 at a starting point for embodiments of the present invention. A semiconductor substrate 102 forms the base of semiconductor structure 100. Substrate 102 may be made from any of several known semiconductor materials such as, for example, silicon, silicon germanium, germanium, or other suitable material. Substrate 102 may be a bulk substrate, or alternatively, may be a silicon-on-insulator (SOI) layer that is disposed on an insulator layer (not shown) which is in turn disposed on an additional bulk substrate (not shown). Substrate 102 comprises top surface 103. A plurality of fins 104 are formed on the substrate, extending from the top surface 103. The fins 104 may be formed by a sidewall image transfer (SIT) process, or other suitable technique.

FIG. 2 shows a semiconductor structure 200 after a subsequent process step of depositing a silicon carbide layer in accordance with embodiments of the present invention. As stated previously, similar elements may be referred to by similar numbers in various figures (FIGs) of the drawing, in which case typically the last two significant digits may be the same. For example, substrate 202 of FIG. 2 is similar to substrate 102 of FIG. 1. A thin layer of silicon carbide 205 is deposited on the fins 204 in a conformal manner. In embodiments, the silicon carbide 205 is deposited using a chemical vapor deposition (CVD) process. The layer of silicon carbide 205 has a thickness T1. In embodiments, T1 may range from about 1 nanometer to about 3 nanometers.

FIG. 3 shows a semiconductor structure 300 after a subsequent process step of performing an anneal to form graphene in accordance with embodiments of the present invention. In embodiments, semiconductor structure 300 is annealed at a process temperature ranging from about 1200 degrees Celsius to about 1400 degrees Celsius for a duration ranging from about 1 minute to about 30 minutes. The anneal causes a graphene layer 306 to be formed from the silicon carbide layer 205 deposited in the previous step by sublimating silicon in the silicon carbide layer. The graphene layer has a thickness T2. In embodiments, T2 may range from about 1 nanometer to about 3 nanometers. In some embodiments, graphene may be deposited directly onto the fins using a transfer of graphene from a metal surface to the semiconductor surface of the fins.

FIG. 4 shows a semiconductor structure 400 after an optional subsequent process step of depositing a protective layer 408 on the graphene in accordance with embodiments of the present invention. In embodiments, protective layer 408 is comprised of silicon nitride (SiN). In embodiments, the protective layer 408 may be deposited using a chemical vapor deposition process, or other suitable technique. The protective layer 408 is deposited in a conformal manner, and serves to protect the graphene layer 406.

FIG. 5 shows a semiconductor structure 500 after a subsequent process step of recessing the protective layer in accordance with embodiments of the present invention. In embodiments, a selective reactive ion etch (RIE) process may be used to recess the protective layer (e.g. silicon nitride) to a depth of D1 from the top 507 of fin 504. In embodiments, depth D1 ranges from about 10 nanometers to about 30 nanometers.

FIG. 6 shows a semiconductor structure 600 after a subsequent process step of depositing a shallow trench isolation layer 610 in accordance with embodiments of the present invention. In embodiments, shallow trench isolation layer 610 may be comprised of silicon oxide, and may be deposited by a chemical vapor deposition (CVD) process. In embodiments, the shallow trench isolation (STI) layer 610 may be deposited to a level above the tops of the fins, and then planarized and recessed to a level below the tops of the fins, such that STI layer 610 has a thickness D2. In embodiments, D2 ranges from about 20 nanometers to about 50 nanometers. Thus, the STI layer 610 extends to an intermediate level L, partially covering the fins.

FIG. 7 shows a semiconductor structure 700 after a subsequent process step of performing a graphene etch in accordance with embodiments of the present invention. In embodiments, the graphene etch may be performed using a selective reactive ion etch process. As a result, the graphene layer 706 is recessed to intermediate level L, such that it partially covers the fins on a lower portion 704L of the fins, while an upper portion 704U of the fins is exposed and not covered by the graphene layer 706.

FIG. 8 shows a semiconductor structure 800 after a subsequent process step of depositing additional shallow trench isolation layer material 809 in accordance with embodiments of the present invention. In embodiments, the second shallow trench isolation (STI) layer 809 may be deposited to a level above the tops of the fins, and then planarized and recessed such that it extends a distance D3 above intermediate level L. In embodiments, distance D3 ranges from about 5 nanometers to about 10 nanometers. The additional STI layer 809 may be comprised of the same material as the previously formed STI layer 710, thus the combination of the two STI layers acts as a single STI layer 810. The STI layer 810 is disposed on the semiconductor substrate 802 between each fin 804 of the plurality of fins, and extends to a level above the graphene layer 806, and thus, covers the graphene layer 806. The graphene layer 806 is conductive, and hence, by using the STI layer 810 to cover the graphene layer 806, undesirable shorts or leakage is prevented. An upper portion 804U of the fin protrudes from the STI layer 810 and has a height D4. The upper portion 804U will serve as the active portion of the fin in the completed integrated circuit. In embodiments, the upper portion 804U has a height D4 ranging from about 20 nanometers to about 30 nanometers. The graphene layer 806 comprises a sidewall portion 806S which is disposed on the fin sidewalls in the lower portion of the fins. The graphene layer 806 may be in direct physical contact with the fins 804. The graphene layer 806 may further comprise base portion 806B which is disposed on the top surface 803 of substrate 802. The graphene layer serves to provide improved thermal conductivity, conducting heat away from the fins 804 and into the substrate 802. In embodiments, the lower portion 804L of the fins may have a thermal conductivity of about $1 \times 10^{-4}$ watts per meter kelvin (W/mK), which is a significant improvement as compared to the thermal conductivity of silicon alone, or the combination of silicon and silicon oxide. This is due to the superior heat transfer capabilities of graphene. Graphene itself has a thermal conductivity of around 4800-5300 W/mK which is around 30 times that of silicon, and over 5000 times that of silicon oxide. Hence, the use of graphene can provide an effective way to transfer heat away from the fins 804.

FIG. 9 is a flowchart 900 indicating process steps for embodiments of the present invention. In process step 950, a graphene layer is formed (see FIG. 3). In process step 952, a protective layer is deposited (see 408 of FIG. 4). In embodiments, the protective layer comprises silicon nitride, and is deposited in a conformal manner. In process step 954, the protective layer is recessed (see 508 of FIG. 5). In process step 956, a first shallow trench isolation layer is deposited (see 610 of FIG. 6). In process step 958, the graphene layer is etched back to approximately the level of the top of the first shallow trench isolation layer (see 706 of FIG. 7). In process step 960, a second shallow trench isolation layer is deposited (see 809 of FIG. 8). From this point forward, industry-standard techniques may be used to complete fabrication of the integrated circuit. This may include, contact formation, deposition of additional dielectric layers, metallization and via layers, and packaging, for example.

Although the invention has been shown and described with respect to a certain preferred embodiment or embodiments, certain equivalent alterations and modifications will occur to others skilled in the art upon the reading and understanding of this specification and the annexed drawings. In particular regard to the various functions performed by the above described components (assemblies, devices, circuits, etc.) the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more features of the other embodiments as may be desired and advantageous for any given or particular application.

What is claimed is:

1. A method of forming a semiconductor structure, comprising:
    forming a plurality of fins on a semiconductor substrate;
    forming a graphene layer on the plurality of fins;
    depositing a first shallow trench isolation layer disposed over the graphene layer to an intermediate level of the plurality of fins;
    recessing the graphene layer to the intermediate level; and
    depositing a second shallow trench isolation layer disposed over the first shallow trench isolation layer, such that the graphene layer is covered by the second shallow trench isolation layer while an upper portion of each fin of the plurality of fins is exposed.

2. The method of claim 1, further comprising depositing a protective layer over the graphene layer prior to depositing the first shallow trench isolation layer.

3. The method of claim 2, wherein depositing a protective layer over the graphene layer comprises depositing a silicon nitride layer.

4. The method of claim 1, wherein forming a graphene layer comprises:
    depositing a layer of silicon carbide; and
    performing an anneal to form the graphene layer by sublimating silicon in the silicon carbide layer.

5. The method of claim 4, wherein depositing a layer of silicon carbide comprises depositing a silicon carbide layer having a thickness ranging from about 1 nanometer to about 3 nanometers.

6. The method of claim 5, wherein performing an anneal comprises performing an anneal at a process temperature ranging from about 1200 degrees Celsius to about 1400 degrees Celsius.

7. The method of claim 6, wherein performing an anneal comprises performing an anneal for a duration ranging from about 1 minute to about 30 minutes.

8. The method of claim 1, wherein recessing the graphene layer is performed using a selective reactive ion etch process.

9. The method of claim 1, wherein depositing the first shallow trench isolation layer and the second shallow trench isolation layer comprises depositing silicon oxide.

* * * * *